United States Patent [19]

Epstein

[11] Patent Number: 4,920,259

[45] Date of Patent: Apr. 24, 1990

[54] APPARATUS FOR PRODUCING A PHASE INSENSITIVE INDEX PULSE FOR MOTION ENCODERS

[75] Inventor: Howard Epstein, Los Altos, Calif.

[73] Assignee: Hewlett-Packard Company, Palo Alto, Calif.

[21] Appl. No.: 252,222

[22] Filed: Sep. 30, 1988

[51] Int. Cl.$^5$ .............................................. G01D 5/34
[52] U.S. Cl. ............................ 250/237.13; 250/237.12
[58] Field of Search ...................... 250/231 SE, 237 G; 341/13; 33/125 A, 125 C

[56] References Cited

U.S. PATENT DOCUMENTS

| 4,451,731 | 5/1984 | Leonard | 250/231 SE |
| 4,477,189 | 10/1984 | Ernst | 250/237 G |
| 4,678,908 | 7/1987 | LaPlante | 250/231 SE |
| 4,794,251 | 12/1988 | Scholian | 341/13 |

Primary Examiner—Edward P. Westin

[57] ABSTRACT

A motion encoder includes a code member that extends along the route of the object whose movement is to be encoded, an energy emitter, and a modulated energy detector assembly. An incremental movement modulation track and two index modulation tracks are positioned on the code member for modulating the emitted energy in response to movement of the object along its route. The energy detector assembly includes an incremental movement energy detector and two index energy detectors. The two index modulation tracks are positioned on opposite sides of, and are each spaced a substantially equal distance from the incremental movement track. Similarly, the two index energy detectors are positioned on opposite sides of, and are each spaced a substantially equal distance from the incremental movement energy detector. The two index energy detectors are adapted for receiving energy modulated by the two index modulation tracks and for generating two index signals that each reach their extreme amplitude at least once as the object travels along its route, and from which an index pulse can be derived with a comparator. Where the code member and the detector assembly are misaligned by certain amounts in the object's direction of motion, such misalignment does not affect the phase of the index pulse derived from the two index signals with the comparator.

19 Claims, 7 Drawing Sheets

APPARATUS FOR PRODUCING A PHASE INSENSITIVE INDEX PULSE FOR MOTION ENCODERS

SPECIFICATION

This invention relates to position sensors or encoders, and particularly, to an optical incremental motion encoder that includes apparatus for producing an index pulse having a phase relationship with the incremental motion signals that is insensitive to misalignments in the encoder.

BACKGROUND OF THE INVENTION

Incremental optical motion encoders are used to resolve the position and movement of an object along a particular route. Such encoders generally include a light source for emitting a light beam, light modulation means for modulating the light beam in response to movement of the object along the route, and a detector assembly for receiving the modulated light and for producing electrical signals indicating the amount of light received by the detectors. As the light is modulated in response to movement of the object, each electrical signal from the detector assembly produces a waveform. The position of the object along its route determines the position of each signal on its particular waveform, that is, the phase of each signal. Thus, the electrical signals from the detectors can be used to indicate the change in location of the object along the route. Two or more properly out-of-phase signals from separate detectors can be used to indicate both change in location and direction of movement.

In order for an incremental motion encoder to produce an indication of the absolute position or location of the object along its route, an index pulse is required at least once along the route. The incremental signals can be used to count incremental movement from the index pulse, and if the position of the object is known at the index pulse, the absolute position of the object at any place along the route can be determined. Thus, to provide an indication of absolute position, change in location, and direction of movement, an incremental encoder generally requires three channels of information, two channels derived from two or more out-of-phase encoder signals that are produced throughout the route of the object and an index signal that is produced at least once along the route and at a known position of the object.

Index or reference signals may also be used in incremental motion encoders for purposes unrelated to providing absolute position information and may also be used in absolute position encoders. For example, a reference pulse may be used to detect errors in the other encoder signals by counting encoder signals between reference pulses. Excess or insufficient counts between reference pulses indicate an error in the encoder signal. However, regardless of wheter an index or reference signal is used in deriving absolute position information or in encoder error detection, the timing or phase relationship between the index or reference signals and the other encoder signals is often critical to proper operation of the encoder.

Figure 1:
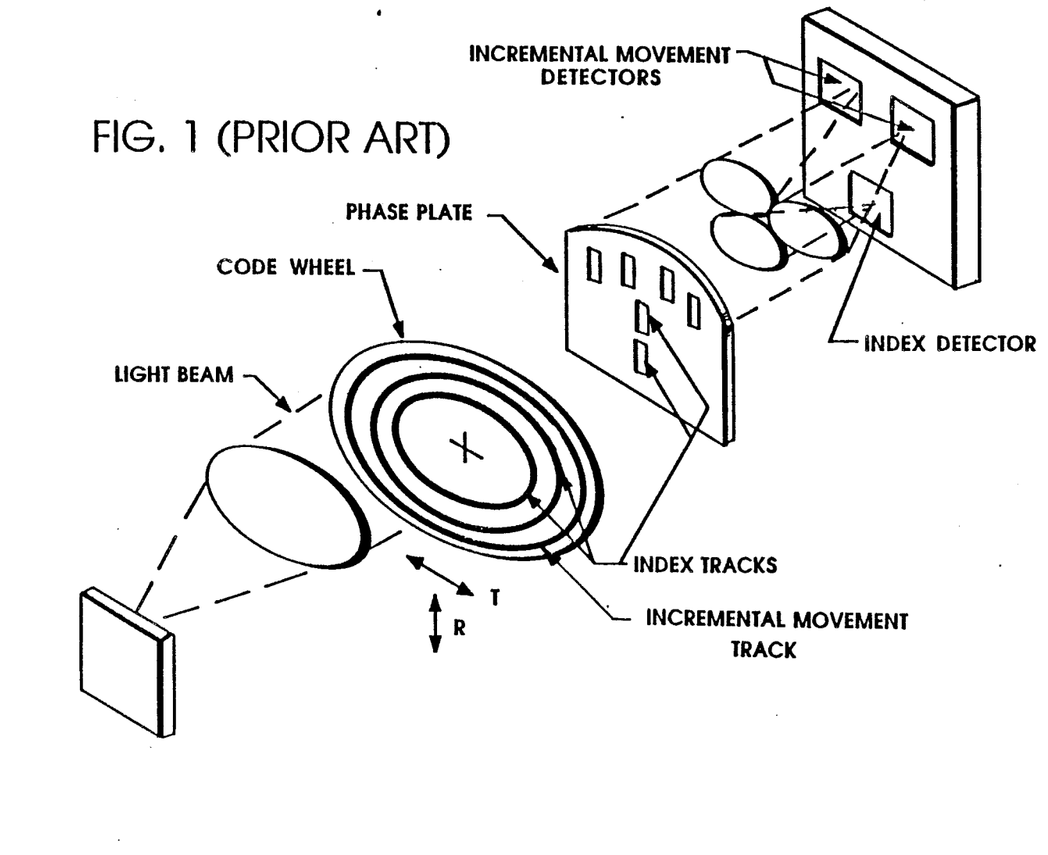
FIG. 1 is a diagrammatic view in perspective of a prior art optical shaft rotation encoder having a code wheel and a phase plate for modulating the light beam.

As shown in FIG. 1, the prior art optical shaft encoders may modulate a light beam with two separate elements, a code wheel that is mounted on the shaft whose movement is being encoded, and a stationary phase plate. The modulated light beam is converted into two analog electrical signals by two separate incremental movement light detectors. From these analog signals, two out-of-phase pulse trains can be produced, and from these pulse trains, change in rotary position and direction of shaft rotation can be determined.

A reference or index pulse may be produced with a push-pull system in which light is modulated with two separate light modulation index tracks on the rotating code wheel and the stationary phase plate. The light modulated by the two index tracks is received by separate index light detectors, and the detectors produce two separate index analog signals from which an index pulse may be derived. The index pulse may be produced by a comparator that compares the two index signals and changes logic states when the levels of the two signals are equal; that is, the index pulse may be a logic state signal between the crossover points of the two analog index signal waveforms. In the illustrated prior art encoder, the index pulse occurs once each revolution of the shaft and attached code wheel.

Prior art optical shaft encoders, such as the type depicted in FIG. 1, were sensitive to misalignment, particularly misalignment between the code wheel and the phase plate. Due to their sensitivity to misalignment, the fabrication and application of these prior art encoders required elaborate alignment procedures and equipment, and generally raised the costs of the encoders.

Phase errors in the incremental movement signals, that is, timing errors between the signal waveforms, were introduced by misalignments in the radial direction, shown in FIG. 1 by arrow R. Also, the timing or phase of the index pulse with respect to the incremental movement signals was sensitive to misalignments in the tangential direction, shown by arrow T in FIG. 1. Phase shifts between the incremental movement signals and index signals due to misalignment in the tangential direction arise because the tracks are at different radii on the code wheel. Where the code wheel is in a tangentially misaligned position, a point on the incremental movement track may be approximately aligned with a corresponding point on the phase plate or detector assembly by rotating the code wheel. However, the amount of rotation needed depends not only upon the magnitude of the tangential misalignment but also upon the radius of the incremental movement track, the required rotation increasing as the radius decreases. For example, the two relatively small radius index tracks shown in FIG. 1 require a greater rotation to correct for tangential misalignment than is required for the incremental movement track having a larger radius. The difference in rotation angles required to achieve compensation for tangential misalignment translates into a phase error between the signals from two radially separated tracks, such as the two radially separated index tracks in FIG. 1.

Figure 2:
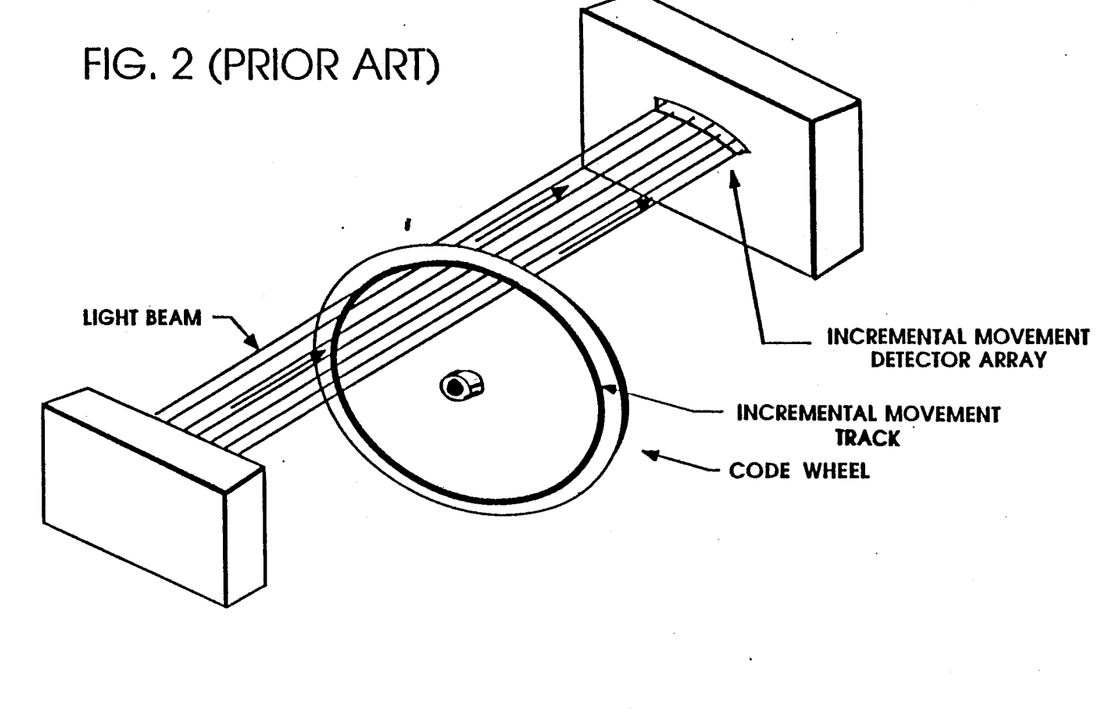
FIG. 2 is a diagrammatic view in perspective of a prior art detector array-type optical shaft rotation encoder having only a code wheel for modulating the light beam.

The prior art optical shaft encoder shown in FIG. 2, and described in U.S. Pat. No. 4,691,101, eliminates the requirement of a phase plate, and uses only a code wheel to modulate the optical beam. To provide the required electrical signals, this particular type of optical encoder uses an array of side-by-side incremental movement light detectors. Each detector in the array produces an analog output signal in response to light modulated as the code wheel rotates, and these analog output signals can be processed to produce two out-of-phase square-wave pulses from which shaft rotation and direction of rotation can be determined.

The prior art encoder shown in FIG. 2 is substantially less sensitive to misalignment than the code wheel/phase plate encoder shown in FIG. 1. This detector array-type prior art encoder, however, does not produce an index pulse for providing absolute positional information. If absolute position information was required, a push-pull system similar to that shown in FIG. 1 could be used. However, such an index pulse would still have been very sensitive to tangential misalignment between the code wheel and the detectors. Thus, the use of an index pulse would have substantially defeated the misalignment insensitivity benefits gained by the detector array-type prior art encoder shown in FIG. 2.

Although optical shaft rotation encoders are shown in FIGS. 1 and 2 for purposes of illustration and ease of description, misalignment problems are by no means limited to shaft rotation encoders. Similar alignment problems with regard to the index modulation tracks are encountered with encoders that indicate the movement of an object along a linear or other route. Index or reference signals in linear motion encoders are sensitive to rotational misalignment between the linear modulator tracks and the detectors. Also, although optical encoders are used to illustrate the misalignment problem with differential signal encoders, other types of electromagnetic radiation may be used if suitable emitter, detector, and modulation means are available.

It is therefore an object of the invention to provide an incremental movement optical encoder that can provide absolute position information as well as direction of movement information, and that is relatively insensitive to misalignments encountered in fabrication and in application to a particular use.

Another object of the invention is to provide a detector array-type encoder for indicating an object's movement along a route that produces an index or reference signal that is insensitive to misalignments encountered in fabrication and application of the encoder.

A further object of the invention is to provide a modulation member adapted for use in a motion encoder for producing a phase insensitive index or reference signal.

SUMMARY OF THE INVENTION

An optical shaft rotation encoder embodying the principles of the invention produces an index pulse that is relatively insensitive to certain misalignments that may arise in fabrication or in application of the encoder to a particular use. The insensitivity of the index pulse arises from a particular configuration of index and incremental movement light modulation tracks on the code wheel, and a corresponding unique configuration of detectors for detecting the light modulated by these tracks.

In one form of the invention, an optical shaft encoder includes a light emitter, a light modulation code wheel for modulating the light in response to the rotation of the shaft, and a light detector assembly for receiving modulated light and for producing both incremental movement analog signals and index analog signals. As with prior art encoders, the index signals may be used in conjunction with the incremental movement signals to provide an indication of the absolute position of the shaft.

In the preferred optical shaft encoder embodiment, the code wheel is connected to the shaft and positioned in the path of a collimated light beam emitted by the light emitter for modulating the light beam in response to the rotation of the shaft. The code wheel includes an incremental movement optical modulation track and two index optical modulation tracks. The incremental movement modulation track modulates light from the light source continuously as the code wheel rotates, and the two index tracks preferably modulate the light to provide push and pull analog signals which reach their maximum amplitude at only a few index or reference points on each revolution of the shaft and code wheel. An index pulse is preferably derived with a comparator as the analog index signals attain the same level or crossover twice at each index point. According to the invention, one index track is positioned on a radially inner side of the incremental movement track and the other index track is positioned on the radially outer side of the incremental movement track. Also, the two index tracks are each spaced a substantially equal distance from the center of the incremental movement track.

The light detector assembly includes an incremental movement detector array for receiving the light modulated by the incremental movement track on the code wheel, and also two index detectors, or preferably detector arrays, for receiving the light modulated by the two index modulation tracks. Corresponding to the code wheel tracks, one index detector is positioned on one radial side of the incremental movement detector array and the other index detector is positioned on the radially opposite side of the incremental movement detector array. Also, the two index detectors are spaced a substantially equal distance from the center of the incremental movement detector array.

With this "split" index track configuration, a tangential misalignment causes one index analog signal to be early with respect to the incremental movement signals and the other index signal. However, the other index signal is late with respect to the incremental movement signals by the same amount. That is, the degree to which one index pulse is late with respect to the incremental signals is equal to the degree that the other index signal is early. With this relationship between index signals and incremental movement signals, certain amounts of misalignment between the center of the code wheel and the center of curvature of the light detectors do not affect the timing of the index signal crossover points. Thus, the timing or phase of the index pulse derived from the push-pull signals of the index detectors is not affected by the misalignment.

These and other objects, advantages and features of the invention will be apparent from the following description of preferred embodiments, considered along with the accompanying drawings.

DESCRIPTION OF THE PREFERRED EMBODIMENTS

Figure 3:
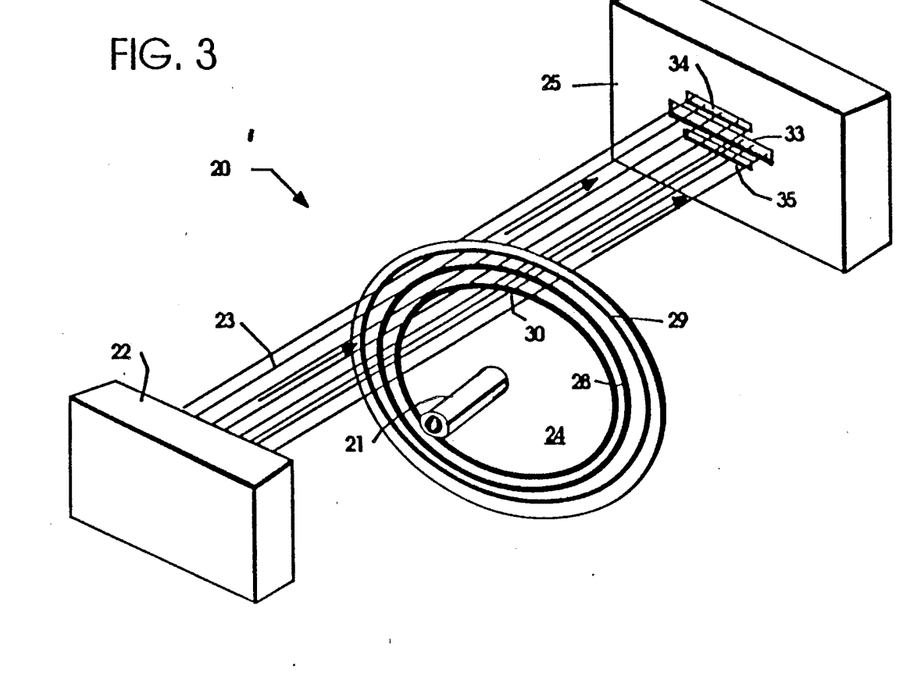
FIG. 3 is a diagrammatic view in perspective of an optical shaft rotation encoder embodying the principles of the invention.

FIG. 3 shows an optical encoder 20 embodying the principles of the invention. The illustrated optical encoder 20 is adapted for indicating the rotational movement and position of a shaft 21 and includes emitter means 22 for emitting a light beam 23, a code wheel 24 for modulating the light beam in response to rotation of the shaft 21, and a detector assembly 25 for receiving the light modulated by the code wheel.

The code wheel or code member 24 includes an incremental movement optical modulation track 28 for modulating the light beam 23 in response to the rotation of the shaft 21. Two index optical modulation tracks, a first index track 29 and a second index track 30, are also provided on the code wheel 24 for modulating the beam. According to the invention, the first index track 29 and the second index track 30 are positioned on the code wheel 24 on radially opposite sides of the incremental movement track 28.

The detector assembly 25 includes an incremental movement detector array 33, positioned in the path of the optical beam 23 for receiving the light modulated by the incremental movement track 28 on the code wheel 24. A first index detector 34 is positioned in the light path 23 for receiving the light modulated by the first index modulation track 30, and a second index detector 35 is positioned in the light path 23 for receiving the light modulated by the second index modulation track 30. These "split" first and second index detectors 34 and 35, respectively, along with the "split" first and second index modulation tracks 29 and 30 on the code wheel 24, form part of a push-pull system for producing an index pulse once each revolution of the code wheel 24.

The preferred optical shaft encoder embodiment of the invention is illustrated somewhat diagrammatically in FIGS. 4–8. This embodiment of the invention includes an emitter/detector module 40, and a code wheel 41 adapted for rotation with a shaft 42. The emitter/detector module 40 includes a slot 43 through which a radially outer portion of the code wheel 41 passes as it rotates along with the shaft 42.

Figure 4:
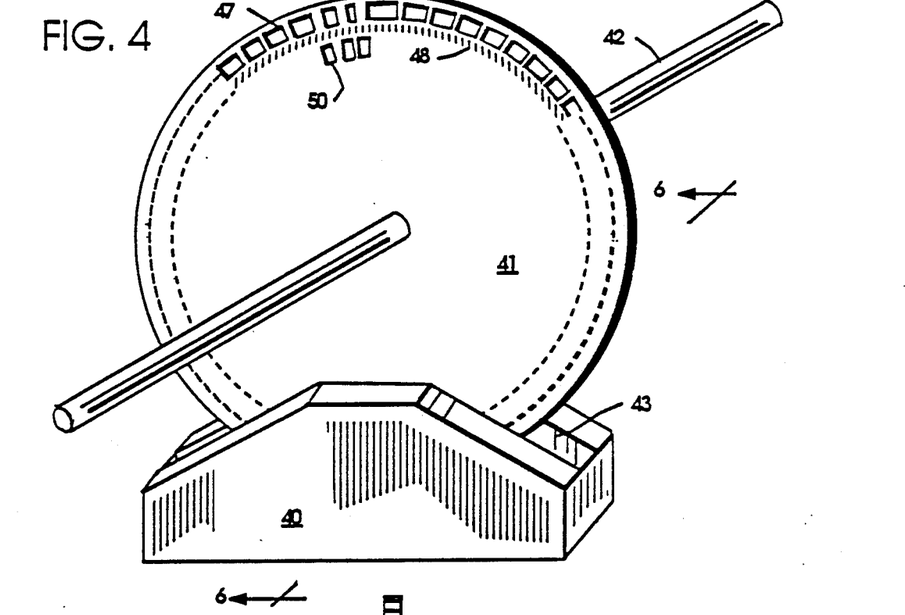
FIG. 4 is a mostly diagrammatic view of an optical shaft rotation encoder in accordance with the preferred embodiment of the invention.
Figure 7:
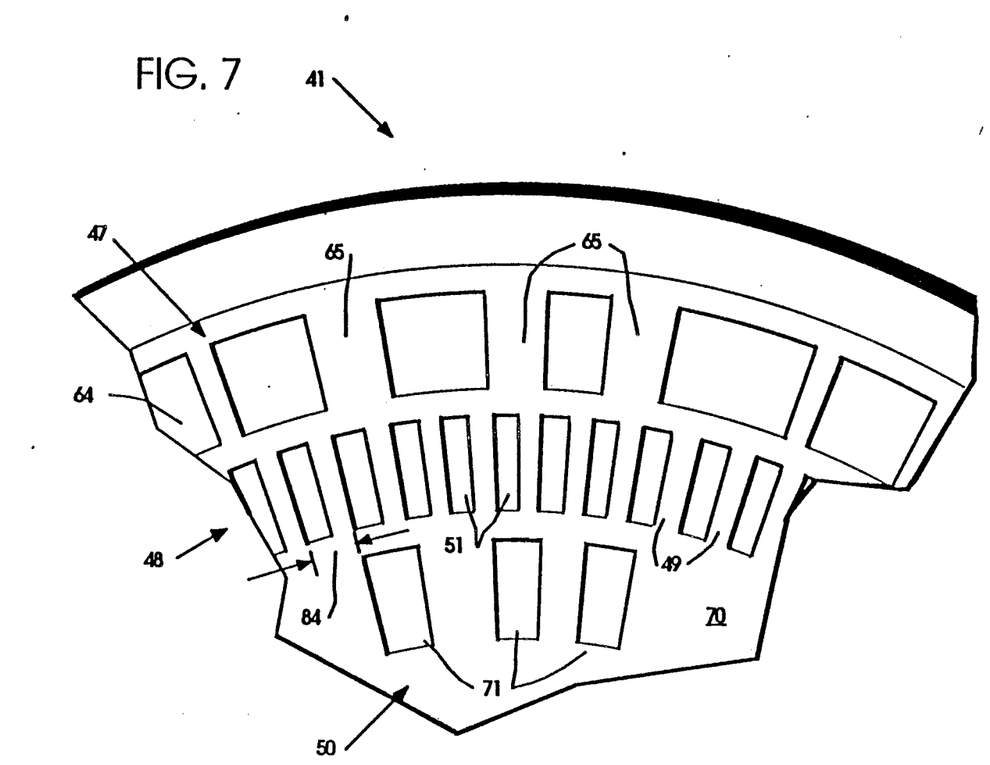
FIG. 7 is a diagrammatic plan view of the code wheel shown in FIGS. 4–6, drawn to an enlarged scale.

As shown in FIG. 4 and in more detail in FIG. 7, the code wheel 41 has three optical tracks, a first index modulation track 47, an incremental movement modulation track 48, and a second index modulation track 50, the three tracks forming three concentric circles of alternating opaque and light-transmissive areas. The radially outermost first index track 47 is primarily made up of light-transmissive sections, while the radially innermost second index track 50 is primarily opaque throughout its circumference. The incremental movement optical track 48 is positioned between the two index tracks 47 and 50 and is made up of evenly spaced opaque areas 49 and light-transmissive areas 51 (shown in FIG. 7) that extend around the entire circumference of the track 48.

Figure 6:
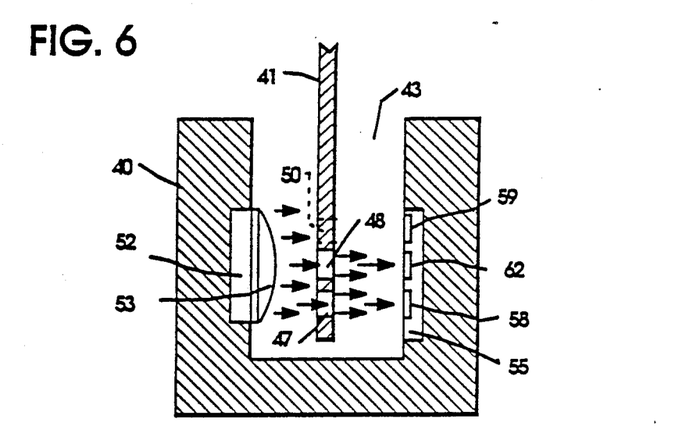
FIG. 6 is a mostly diagrammatic view in section of the optical encoder module and a portion of the code wheel shown in FIGS. 4 and 5, taken along line 6—6 in FIG. 4.

As shown in FIG. 6, the emitter/detector module 40 includes an LED 52, an emitter lens 53, and a modulated-light detector assembly 55. LED 52 provides light preferably from a small or narrow area and approximates a point light source. The emitter lens 53 is positioned to receive light from the LED 52 and to provide one substantially collimated beam of light directed across the module slot 43 to the modulated-light detector assembly 55 positioned on the opposite side of the module slot 43.

Figure 8:
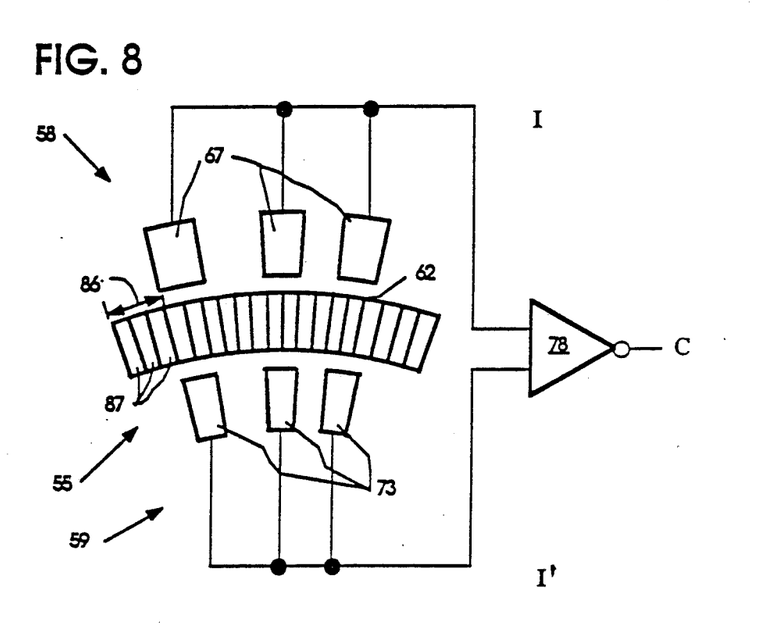
FIG. 8 is a diagrammatic plan view of a detector array assembly for detecting the light modulated by the code wheel shown in FIGS. 4–7, drawn to an enlarged scale and also showing the detector outputs of the two index tracks.

The modulated-light detector assembly 55 is shown in relationship to the LED 52 and code wheel 41 in FIG. 6 and in an enlarged-scale plan view in FIG. 8. Referring particularly to FIG. 6, the detector assembly 55 includes a first index detector array 58 positioned across the module slot 43 from the LED 52 to receive light modulated by the first index modulation track 47 on the code wheel 41. In the illustrated rotational orientation of the code wheel 41, light from the collimated beam passes through the large light-transmissive areas on the first index track 47 and is received by the first index detector array 58 to produce a significant analog first index output signal. A second index detector array 59 is positioned across the slot 43 in position to receive light modulated by the second index track 50. In the illustrated rotational position of the code wheel 41, the second index track 50 blocks light from the LED 52 so that the second index detector array 59 produces a low-level or insignificant analog output signal.

An incremental movement detector array 62 is positioned between the two index detector arrays 58 and 59, in position to receive light from the LED 52 that is modulated by the incremental movement track 48 on the optical modulation code wheel 41. Both the incremental movement detector array 62 and the incremental movement track 48 are preferably of the type described in U.S. Pat. No. 4,691,101, which is incorporated herein by reference.

Referring to FIG. 7, each light-transmissive area 51 and an adjacent opaque area 49 of the incremental movement track 48 represents one cycle or period 84 of the code wheel 41. Each incremental movement track cycle 84 preferably corresponds to one detector cycle 86 of four incremental movement detectors 87 shown in FIG. 8. Each light detector 87 produces an analog electrical output signal in response the modulated light it receives, and these signals may be processed to provide a two-channel output from which the rotational movement of the shaft 42 (FIGS. 4 and 5) and its direction of rotation can be determined. The processing circuitry for producing the two channel output is described in U.S. Pat. Nos. 4,271,364 and 4,259,570, which are also incorporated herein by reference.

As discussed in U.S. Pat. No. 4,691,101, the preferred mechanical position of the four light detectors causes the output signals to have identically shaped waveforms that are 90 degrees out of phase with each other. However, the quadrature or 90 degree phase relationship between the incremental movement signals is simply one convenient and preferred relationship. Alternatively, the incremental movement light detectors may be arranged to produce analog signals having other phase relationships or even arranged to produce a single analog signal.

Figure 5:
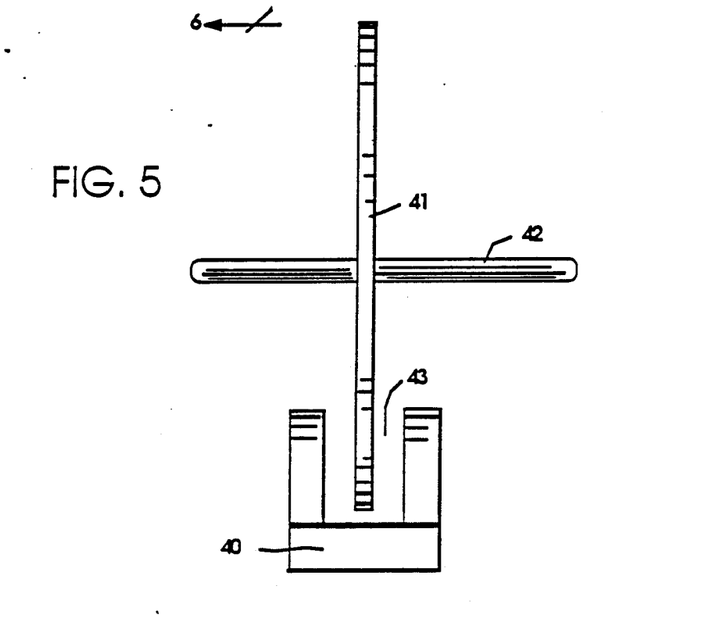
FIG. 5 is a side view of the optical encoder shown in FIG. 4.

As shown in FIG. 7, the first index modulation track 47 on the code wheel 41 is made up mostly of large light transmissive areas 64 around its circumference, but includes three index opaque areas 65. Referring to FIG. 8, the first index detector array 58 on the detector assembly 55 comprises three light detectors 67 which correspond to the three index opaque areas 65 on the first index modulation track 47. Due to the curvature of the code wheel 41 both the opaque areas 65 on the code wheel and the corresponding detectors 67 on the detector array 58 are generally trapezoidal in shape. Also, the three opaque areas 65 and detectors 67 are unevenly spaced apart to provide a pronounced low analog index signal when the opaque areas and the light detectors line up once each revolution of the code wheel 41 and shaft 42 (FIGS. 4 and 5). This uneven spacing for providing a pronounced index signal is described in U.S. Pat. No. 4,451,731, which is incorporated herein by reference.

The second index modulation track 50 is made up mostly of one extended opaque area 70 that extends substantially around the track's circumference, but includes three unevenly spaced index light-transmissive areas 71, each index light-transmissive area 71 aligning radially with one of the index opaque areas 65 the first index modulation track 47. The second index detector array 59 includes three unevenly spaced apart detectors 73, each detector 73 being radially aligned with the first index detectors 67 and corresponding to the index light-transmissive areas 71 of the second index modulation track 50. The detectors 73 and the light-transmissive areas 71 are also generally trapezoidal in shape due to the curvature of the code wheel 41.

Although the illustrated preferred encoder shows the index opaque areas 65 being radially aligned with the index light-transmissive areas 71, and the detectors 67 and 73 similarly radially aligned, such alignment is not necessary to the invention. Alternatively, the opaque areas and light-transmissive areas may be offset at different radial positions. However, the corresponding light detectors must be offset at the same radial positions to produce the desired push-pull signals.

Pursuant to the invention, the first and second index tracks 47 and 50 are spaced a substantially equal distance from the incremental movement track 48, on radially opposite sides thereof. That is, the distance between the center of each opaque area 65 of the first index track 47 and the center of the incremental movement track 48 is approximately equal to the distance between the center of the incremental movement track and the corresponding radially aligned light-transmissive area 71 on the second index modulation track 50. Similarly, the first and second index detector arrays 58 and 59 are also spaced a substantially equal distance from the incremental detector array 62 and on radially opposite sides thereof. Also, each opaque area 65 on the first index modulation track 47 has an area approximately equal to the area of the radially opposite index light-transmissive area 71. Thus, the opaque area 65 is somewhat wider and shorter than its radially opposite index light-transmissive area 71 on the innermost, second index modulation track 50 due to the curvature of the code wheel. Since the total detector area of the first index detector array 58 is equal to the total detector area of the second index detector array, the arrays produce substantially equal signals for a given intensity of light.

In the illustrated preferred form of the invention, three optical modulation areas on each index track 47 and 50 are used to provide an index signal. Although three index areas are illustrated, two areas, or even one area may be used to produce an index signal, particularly where stronger light beams are available. Also, more than three areas may be used within the scope of the invention.

All of the light detectors in the detector assembly 55, the incremental movement detectors 63 and the first and second index detectors 67 and 73, are preferably photodiodes formed using bipolar semiconductor technology. However, other types of semiconductor technology can be employed without departing form the scope of the invention. Also, in the preferred form of the invention, the light detectors of the detector assembly 55 and the required signal processing circuity may be implemented on a single semiconductor chip.

Figure 9:
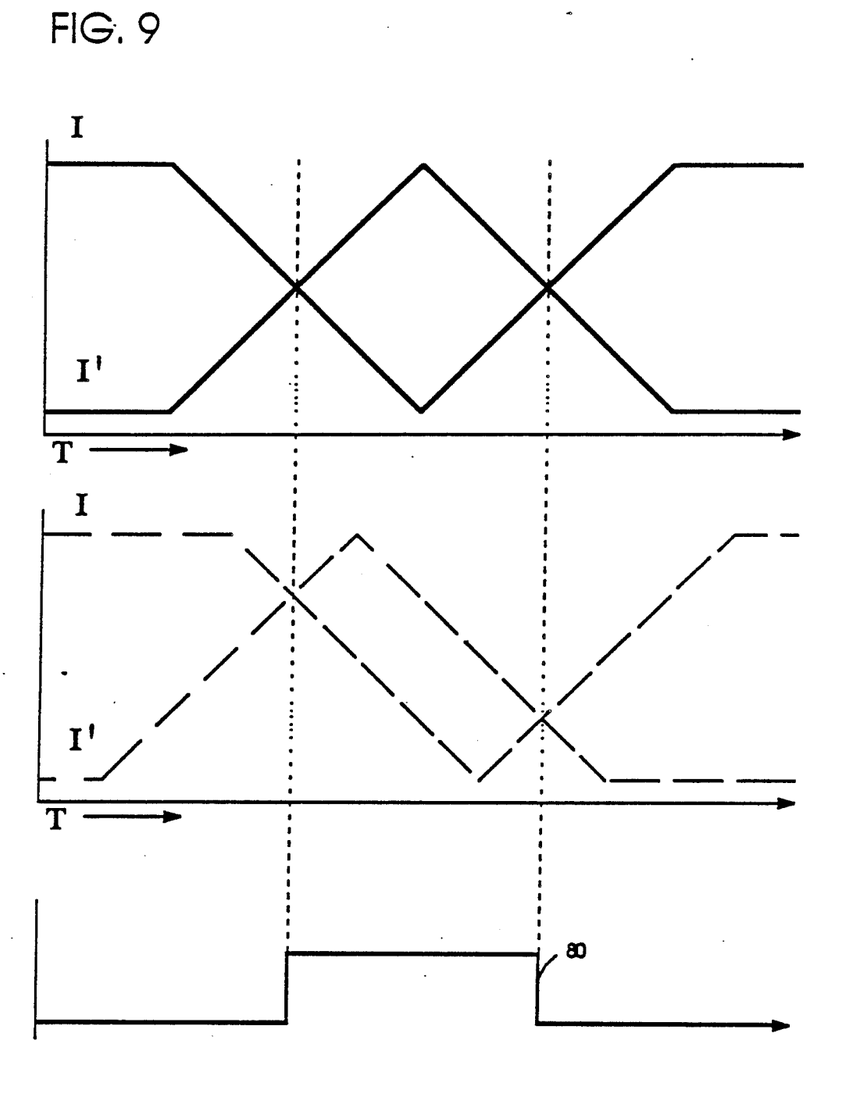
FIG. 9 is a graphical representation of the output signals produced by the index light detectors shown in FIG. 8 and the index pulse produced therefrom, both with and without tangential misalignment between the code wheel and the detectors. For comparison, the solid lines I and I' in FIG. 9 show the signals that would be produced when no tangential misalignment is present.

As shown graphically in FIG. 9, as the code wheel 41 rotates through the module slot 43 (FIGS. 4 and 5), the first and second index detector arrays 58 and 59 produce photocurrent signals I and I', respectively. These waveforms are compared by comparator 78 (FIG. 8), which generates an index pulse 80 in response to the signals I and I' attaining the same signal level.

The signal I, produced by the first index detector array 58, maintains a relatively high level over most of the revolution of the shaft, the relatively high photocurrent levels resulting as light from the LED 52 (FIG. 6) passes through the light-transmissive areas 64 (FIG. 7), which make up most of the first index modulation track 47. The signal I', produced by the second index detector array 59, maintains a relatively low level over most of the code wheel rotation as light from the LED 52 is blocked by the mostly opaque and radially inner, second index modulation track 50. However, in the illustrated preferred embodiment, once each revolution of the code wheel 41, the three index opaque areas 65 of the first index modulation track 47 pass the corresponding index detectors 67 (FIG. 8) on the detector assembly 55, to produce the substantially triangular waveform of I. The three index light-transmissive areas 71 of the second index modulation track 50 also pass their corresponding detectors 73 once each revolution to produce the triangular waveform of signal I'.

The solid line in the top graph of FIG. 9 illustrates the two waveforms of signals I and I' where there is no misalignment between the center of the code wheel 41 and the center of curvature of the two index detector arrays 58 and 59. However, where the code wheel 41 and the detector arrays 58 and 59 are misaligned in the tangential direction, one of the signals I or I', depending upon the direction of misalignment and the direction of shaft rotation, will lead the other signal. Tangential misalignment may be defined as misalignment in the direction of motion, that is, in a direction perpendicular to a line extending in the direction of motion and through the center of each index detector array area.

In prior art encoders, where the index modulation tracks and index detectors were spaced different distances from the incremental movement track, the timing change between index signals due to tangential misalignment moved the cross-over points of the signals I and I' in time. A tangential misalignment thus altered the timing or phase of the index pulse with respect to the incremental movement signals. However, pursuant to the invention, such a tangential misalignment not only causes one signal (the dashed line I' in FIG. 9) to be early, but also causes the other signal (the dashed line I) to be late by the same amount of time. FIG. 9 also shows that this equal but opposite change in timing of the signals I and I does not affect the timing of the cross-over points of the two signal waveforms. Thus, the timing or phase of the index pulse 80, shown in the bottom graph of FIG. 9, is not affected by the tangential misalignment.

ALTERNATE EMBODIMENTS

The invention is described in the foregoing as applied to an optical shaft motion encoder with one set of two index modulation tracks and a corresponding set of two index detectors. However, in some applications multiple sets of two index modulation tracks and two index detectors may be desired. Also, the invention is not limited to rotation encoders but has application to linear encoders or, more generally, to any modulated signal motion encoder in which an index or reference pulse is desired. All such motion encoders are sensitive to certain misalignments. Rotation or curved path encoders are sensitive to tangential misalignments as previously discussed, and linear motion encoders are sensitive to rotational misalignments in which the modulation member is rotated somewhat with respect to the detectors. In linear encoders particularly, but also in other types of motion encoders, the detector assembly may be connected for movement with the object whose motion is being encoded rather that the modulation member being so connected as illustrated in the figures.

In optical encoders the light modulation member may modulate the light with reflective and non-reflective areas rather than with the transmissive and non-transmissive areas. For example, in the code wheel shown in FIG. 7 the light transmissive areas 64, 51, and 71 could be replaced by reflective areas, and the opaque areas 65, 49, and 70 could be replaced by non-reflective areas. Of course in this reflection-modulator form of the invention the detector assembly would be positioned on the same side of the modulating member as the emitter means in position to receive light reflected by the reflective areas on the code wheel.

Furthermore, the invention may be applied not only to provide an index pulse for an incremental motion encoder, but also to provide a reference pulse for either an incremental encoder or an absolute position encoder. Such reference pulses may be used in detecting encoder errors as previously discussed. Also, index or reference pulses produced according to the invention may be provided at more than one point along an objects route of motion.

The invention may also be applied to non-optical encoders, which modulate and detect some other form of electromagnetic radiation in response to the movement of an object along a route. These non-optical embodiments of the invention utilize different emitters, modulators, and detectors suited to the particular type of electromagnetic energy chosen. However, the split configuration of index modulation tracks and detector arrays produces substantially the same phase insensitive index or reference pulse regardless of the type of energy modulated and detected.

The above described preferred embodiments are intended to illustrate the principles of the invention, but not to limit the scope of the invention. Various other embodiments and modifications to these preferred embodiments may be made by those skilled in the art, without departing from the scope of the following claims.

What is claimed is:

1. An optical encoder for indicating the rotational movement of a shaft, the optical encoder comprising:
   emitter means for emitting a light beam along a light path;
   light modulation means placed in the light path for modulating the light beam in response to the rotation of the shaft, wherein the light modulation means includes a code wheel having an incremental movement light modulation track that forms generally a circle concentric with the shaft, and at least one set of two index light modulation tracks, the two index light modulation tracks of each set being spaced a substantially equal distance from the incremental movement track on radially opposite sides thereof;
   incremental movement detector means positioned in the light path for receiving light from the light beam modulated by the incremental movement light modulation track and for generating at least one output signal in response to the rotation of the shaft;
   one set of two index detector means for each set of index light modulation tracks, the two index detector means of each said set being positioned in the light path and being spaced a substantially equal distance from the incremental movement detector means on opposite sides thereof, for receiving light from the light beam modulated by one of the sets of index light modulation tracks and for generating two index output signals that each reach their extreme amplitude at least once during each revolution of the shaft, the two index signals reaching their respective extreme amplitude simultaneously when there is substantially no misalignment between the light modulation means and the incremental movement and index detector means; and
   means for combining the two analog index signals for obtaining a phase insensitive index pulse.

2. The optical encoder of claim 1 wherein each set of index tracks comprises:
   a pull index light modulation track having mostly light-transmissive areas, but with at least one index opaque area; and
   a push index light modulation track made up mostly of an opaque area but with at least one index light-transmissive area.

3. The optical encoder of claim 2 wherein the pull index track is positioned on the radially outer side of the incremental movement light modulation track.

4. The optical encoder of claim 3 including comparator means for each set of index detector means for comparing the index signals produced by one said set of index detector means and for producing an output pulse in response to said index signals.

5. The optical encoder of claim 4 wherein:
   each set of index detector means are radially aligned with each other; and
   each index opaque area and each index light transmissive area of each set of index light modulation tracks are radially aligned with each other.

6. The optical encoder of claim 5 wherein the emitter means is an LED with a collimating lens.

7. The optical encoder of claim 6 wherein the incremental movement detector means and the index detector means are photodiodes.

8. The optical encoder of claim 7 wherein the incremental movement detector means and the index detector means are implemented on a common semiconductor substrate.

9. An encoder for indicating an object's movement along a route, the encoder comprising:
   emitter means for emitting energy along an energy path;
   energy modulation means positioned in the energy path for modulating the energy in response to the object's movement along the route, the energy modulation means including a code member having an incremental movement energy modulation track that extends along the route, and at least one set of two index energy modulation tracks, the two index energy modulation tracks of each set being positioned on opposite sides of, and a substantially equal distance from the incremental movement energy modulation track.
   incremental movement detector means positioned in the energy path for receiving the energy modulated by the incremental movement energy modulation track and for generating at least one encoder output signal in response to the object's movement along the route;
   one set of two index detector means for each set of index energy modulation tracks, the two index detector means of each said set being positioned in the energy path on opposite sides of, and a substantially equal distance from the incremental movement energy modulation track, for receiving the energy modulated by one of the sets of index energy modulation tracks and for generating two index signals that each reach their extreme amplitude at least once during each excursion of the object across the route, the two index signals reaching their respective extreme amplitude simultaneously when there is no misalignment between the energy modulation means and the incremental movement and index detector means; and
   means for combining the two analog index signals for obtaining a phase insensitive index pulse.

10. The motion encoder of claim 9 wherein:
   the object is a shaft and the route is one revolution of the shaft; and
   the code member is a code wheel and is substantially concentrically attached to the shaft for modulating the energy from the emitter means in response to rotation of the shaft.

11. The motion encoder of claim 9 wherein the energy emitted by the emitter means is light energy.

12. The motion encoder of claim 11 wherein the emitter means comprises an LED and a collimating lens.

13. The motion encoder of claim 12 wherein the incremental movement energy modulation track and each set of index energy modulation track are made up of reflective and non-reflective areas for modulating the light beam.

14. The motion encoder of claim 12 wherein the incremental movement energy modulation track comprises an optical track having alternating light-transmissive and opaque sections adapted for modulating the light in response to the movement of the object along the route.

15. The motion encoder of claim 14 wherein each set of index energy modulation tracks comprises:
   a pull index light modulation track having mostly light-transmissive areas, but with at least one index opaque area; and
   a push index light modulation track made up mostly of an opaque area but with at least one index light-transmissive area.

16. The motion encoder of claim 9 wherein each set of two index energy modulation tracks is adapted for modulating the energy from the emitter means so that the corresponding set of two index detector means generate two index signals that reach their respective extreme amplitude more than once during each excursion across the route.

17. The motion encoder of claim 9 wherein the energy modulation means includes only one set of two index energy modulation tracks.

18. The motion encoder of claim 9 wherein the incremental movement detector means and each set of index detector means are connected to the object and are adapted to move with the object as it travels along its route.

19. The motion encoder of claim 9 wherein the code member is connected to the object and is adapted to move with the object as it travels along its route.

* * * * *